United States Patent
Hattori et al.

(10) Patent No.: US 9,349,397 B2
(45) Date of Patent: May 24, 2016

(54) HIGHER STABILITY READ HEAD UTILIZING A PARTIAL MILLING PROCESS

(71) Applicant: HGST Netherlands B.V., Amsterdam (NL)

(72) Inventors: Masashi Hattori, Odawara (JP); Norihiro Okawa, Odawara (JP); Kouichi Nishioka, Hiratsuka (JP); Kouji Okazaki, Odawara (JP)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/226,673

(22) Filed: Mar. 26, 2014

(65) Prior Publication Data

US 2015/0279392 A1    Oct. 1, 2015

(51) Int. Cl.
*G11B 5/39* (2006.01)
*G11B 5/127* (2006.01)

(52) U.S. Cl.
CPC ............ *G11B 5/3906* (2013.01); *G11B 5/1272* (2013.01); *Y10T 29/49052* (2015.01); *Y10T 428/1121* (2015.01)

(58) Field of Classification Search
CPC ..... H01L 27/20; G11B 5/3906; G11B 5/1272
See application file for complete search history.

(56) References Cited

U.S. PATENT DOCUMENTS

| | | | |
|---|---|---|---|
| 5,933,297 A * | 8/1999 | Hoshiya | B82Y 10/00 360/324.1 |
| 6,762,915 B2 | 7/2004 | Pokhil et al. | |
| 6,980,403 B2 | 12/2005 | Hasegawa | |
| 7,035,062 B1 | 4/2006 | Mao et al. | |
| 7,436,638 B1 | 10/2008 | Pan | |
| 7,821,747 B2 | 10/2010 | Gill | |
| 8,266,785 B2 | 9/2012 | Freitag et al. | |
| 8,576,518 B1 * | 11/2013 | Zeltser | G11B 5/3912 360/319 |
| 2006/0198059 A1 | 9/2006 | Sakai et al. | |
| 2008/0144226 A1* | 6/2008 | Kagami | B82Y 10/00 360/313 |
| 2009/0021870 A1 | 1/2009 | Pinarbasi | |
| 2009/0128962 A1* | 5/2009 | Murai | B82Y 10/00 360/313 |
| 2009/0262465 A1* | 10/2009 | Hatatani | B82Y 10/00 360/319 |
| 2011/0273802 A1 | 11/2011 | Zhou et al. | |
| 2012/0281319 A1 | 11/2012 | Singleton et al. | |
| 2012/0281320 A1 | 11/2012 | Singleton et al. | |

(Continued)

OTHER PUBLICATIONS

HGST, a Western Digital company, "High-Pinning Iridium—Manganese—Chromium (IrMnCr) Read Sensors for High Reliability & Stability," Whitepaper, Nov. 2007, pp. 1-2.

*Primary Examiner* — Jerome Jackson, Jr.
*Assistant Examiner* — Wasiul Haider
(74) *Attorney, Agent, or Firm* — Zilka-Kotab, PC

(57) ABSTRACT

In one embodiment, a method for forming a magnetoresistive read head includes forming a fixed layer having a first ferromagnetic material that has a fixed direction of magnetization above a lower shield layer, forming a free layer having a second ferromagnetic material positioned above the fixed layer, the free layer having a non-fixed direction of magnetization, forming a first mask above the free layer, the first mask having a predetermined width based on a track width of a magnetic medium, etching the free layer down to the fixed layer using the first mask as a guide, wherein substantially none of the fixed layer is etched, and wherein the fixed layer extends beyond both sides of the free layer in a cross-track direction, and forming magnetic domain control films on both sides of the free layer in the cross-track direction, the magnetic domain control films including a soft magnetic material.

20 Claims, 13 Drawing Sheets

(56) References Cited

U.S. PATENT DOCUMENTS

2013/0128381 A1* 5/2013 Okamura ............. G11B 5/3932
            360/75
2013/0140660 A1* 6/2013 Fukami ................. G11C 11/14
            257/421
2013/0293225 A1* 11/2013 Singleton et al. ............. 324/252

* cited by examiner

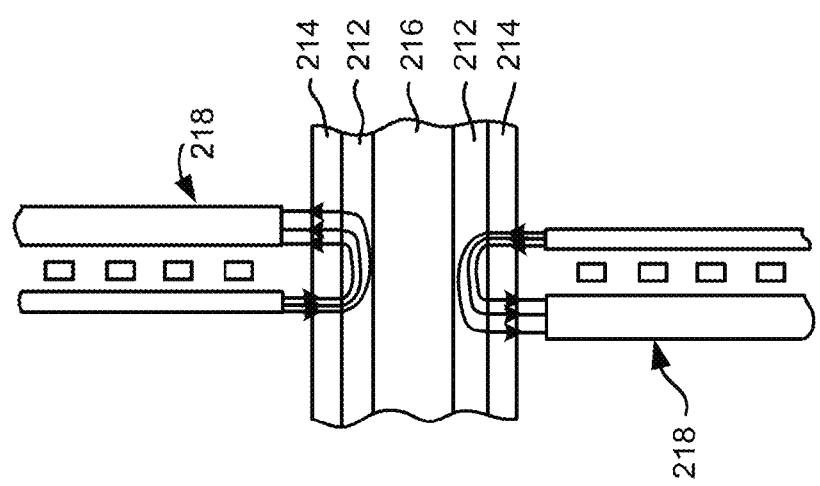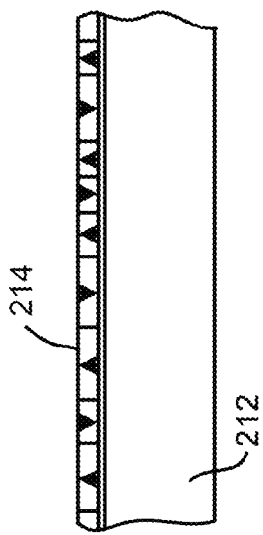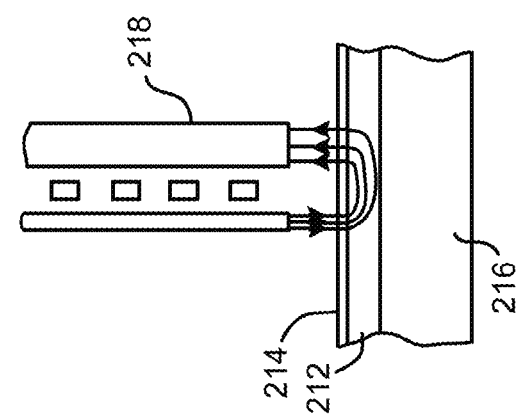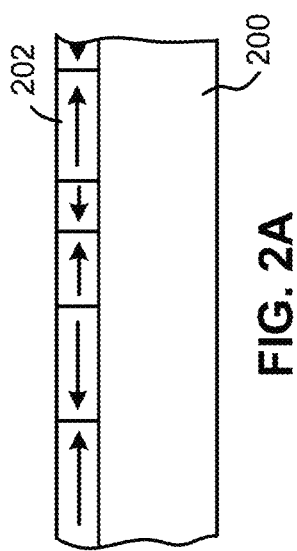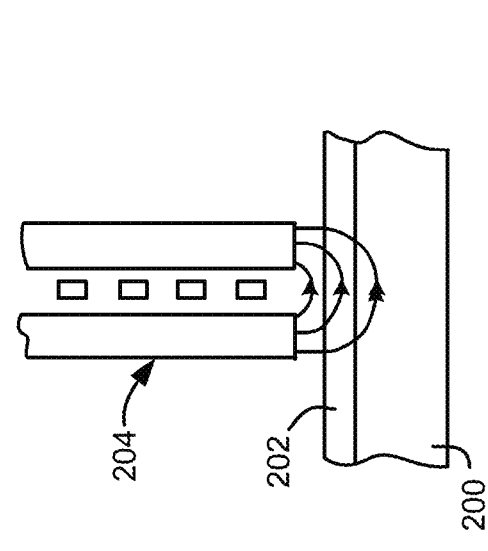

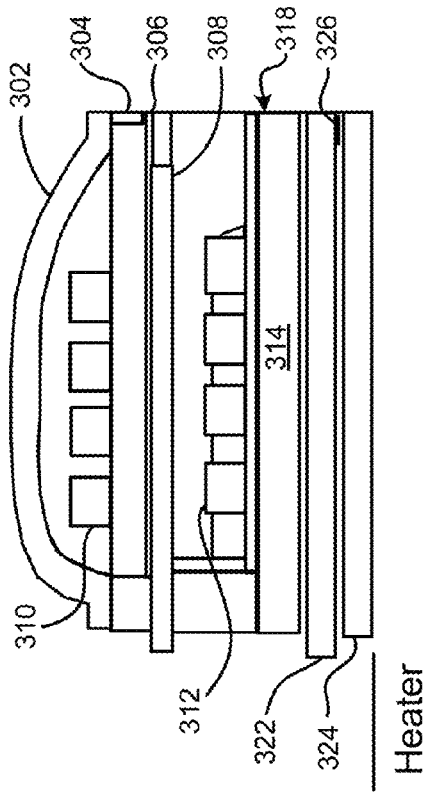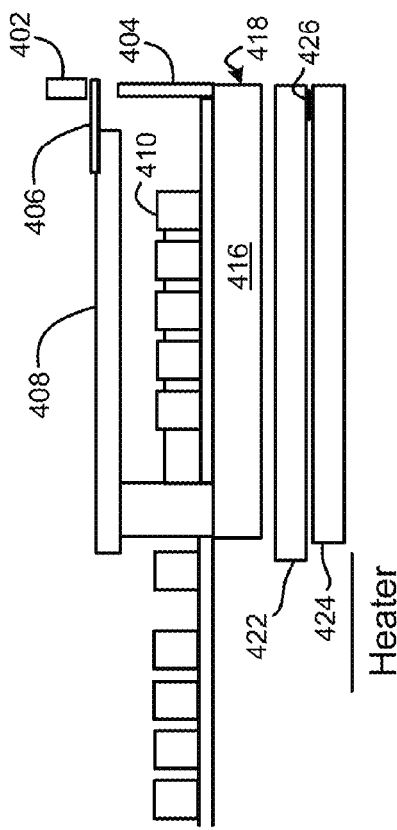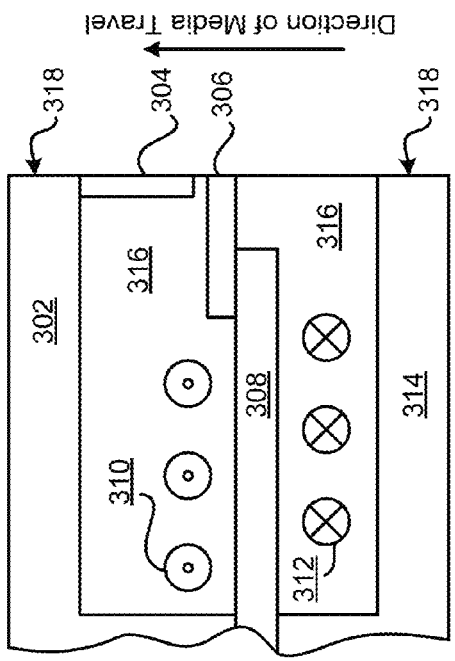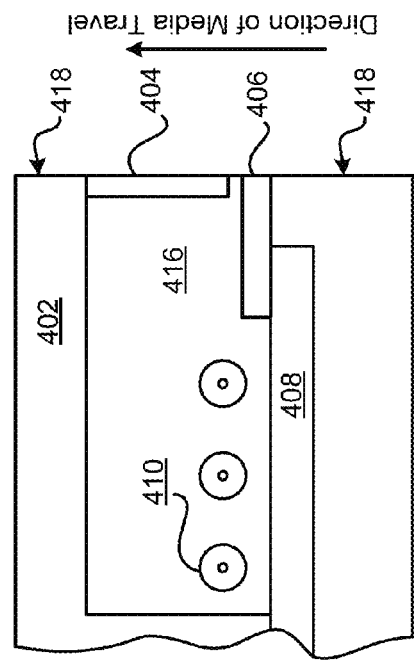

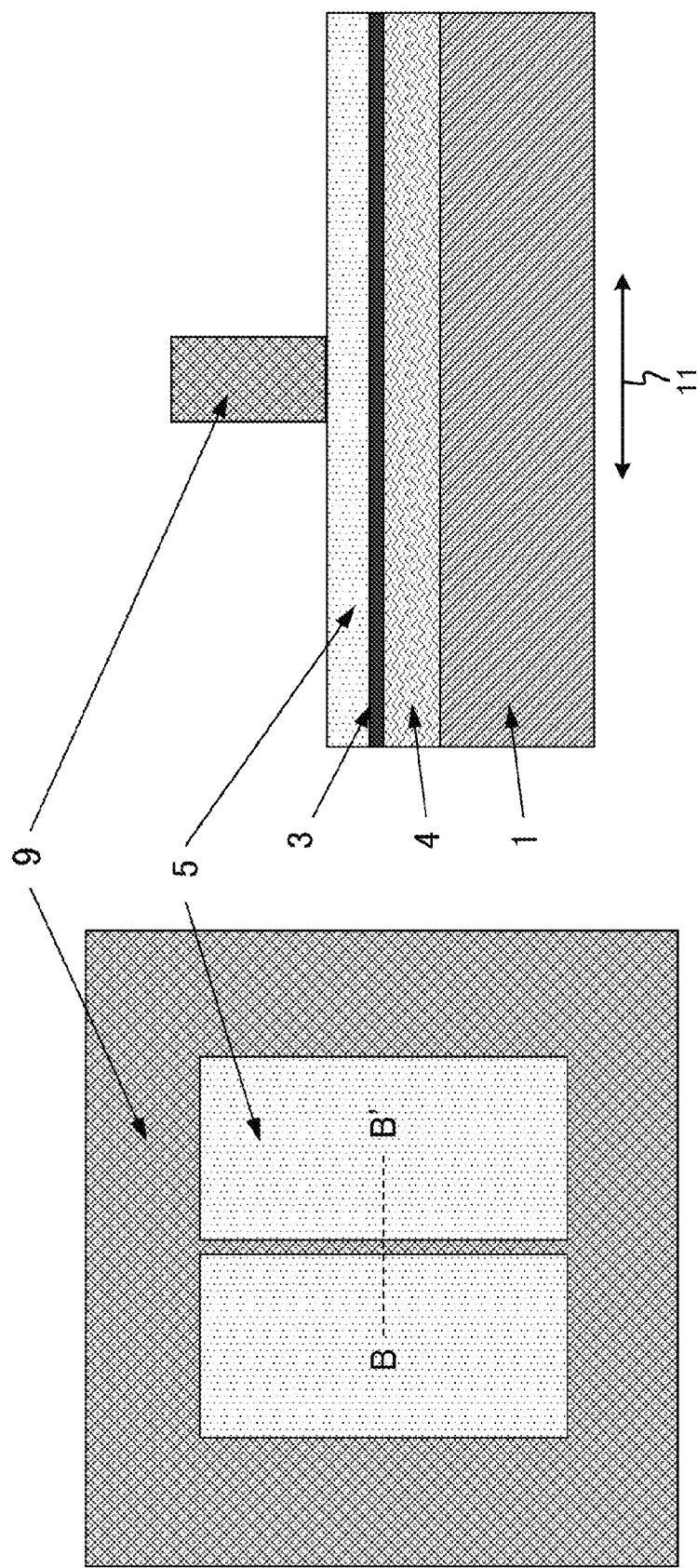

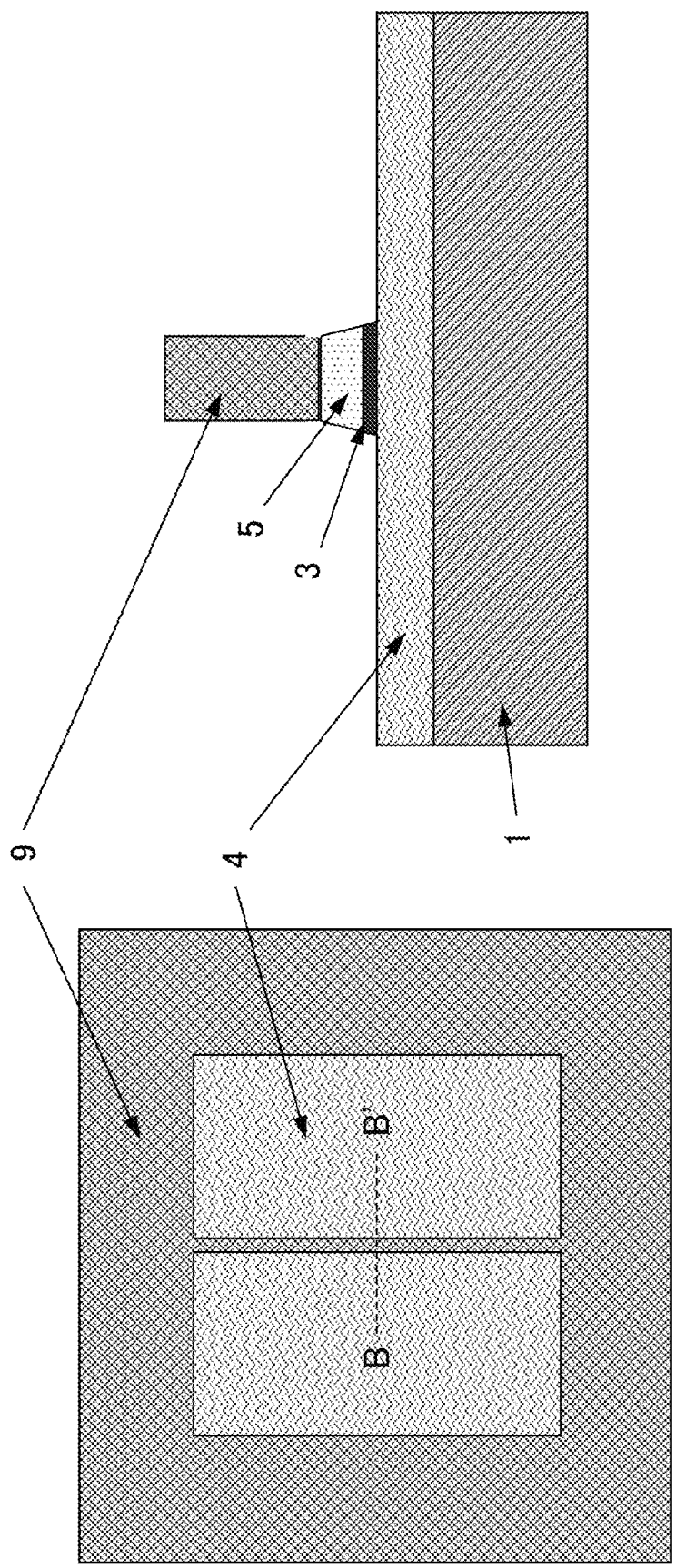

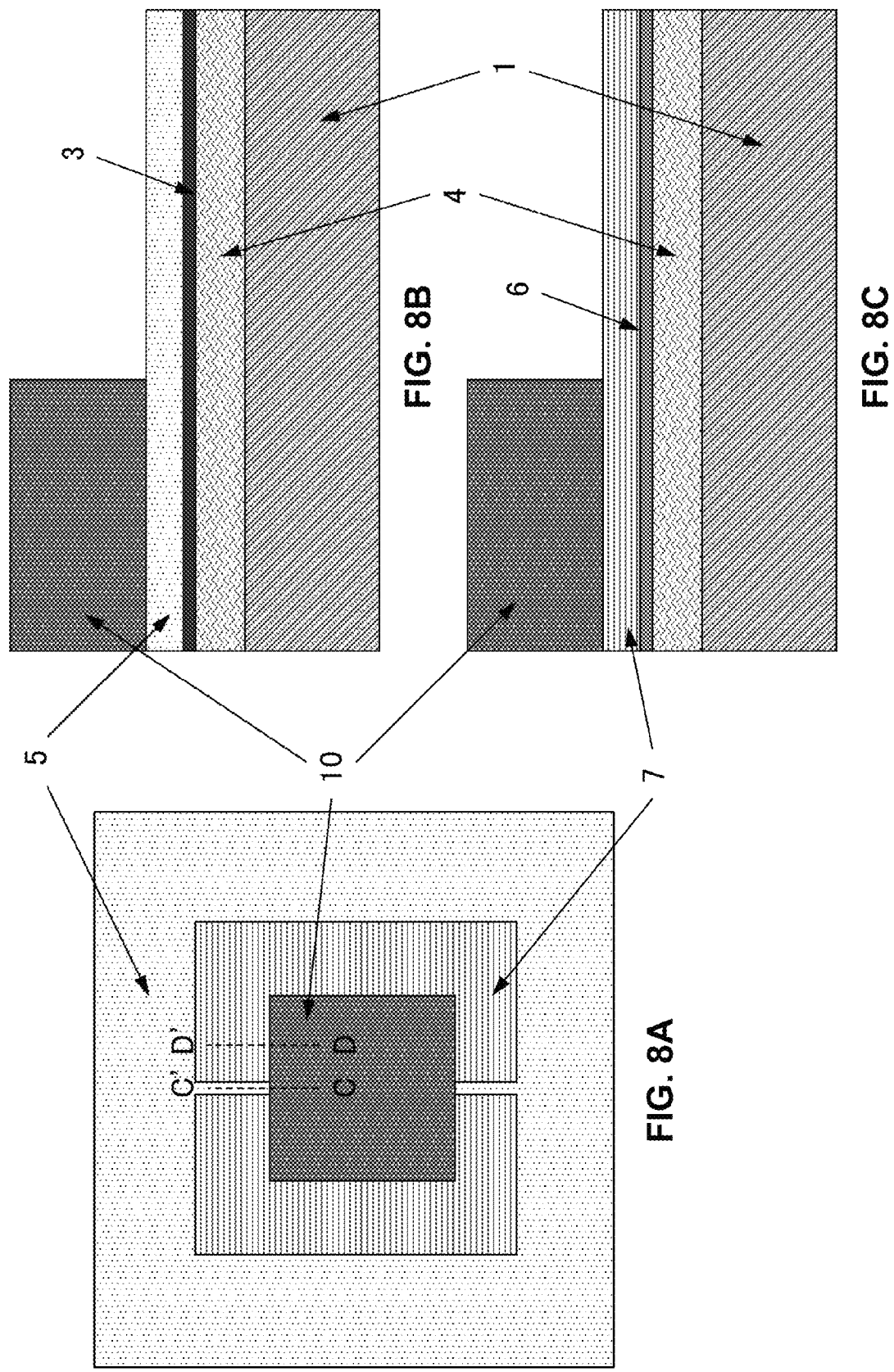

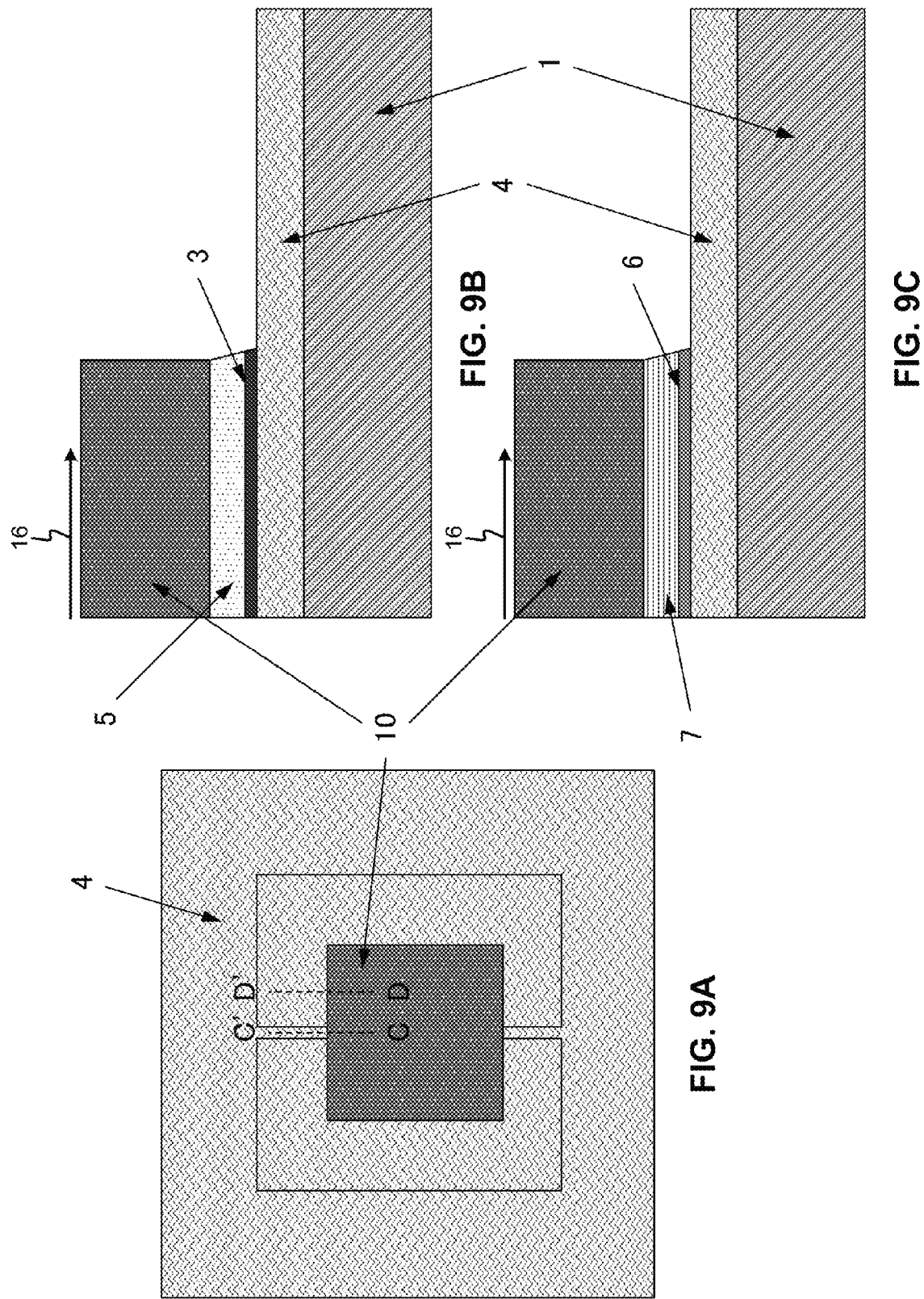

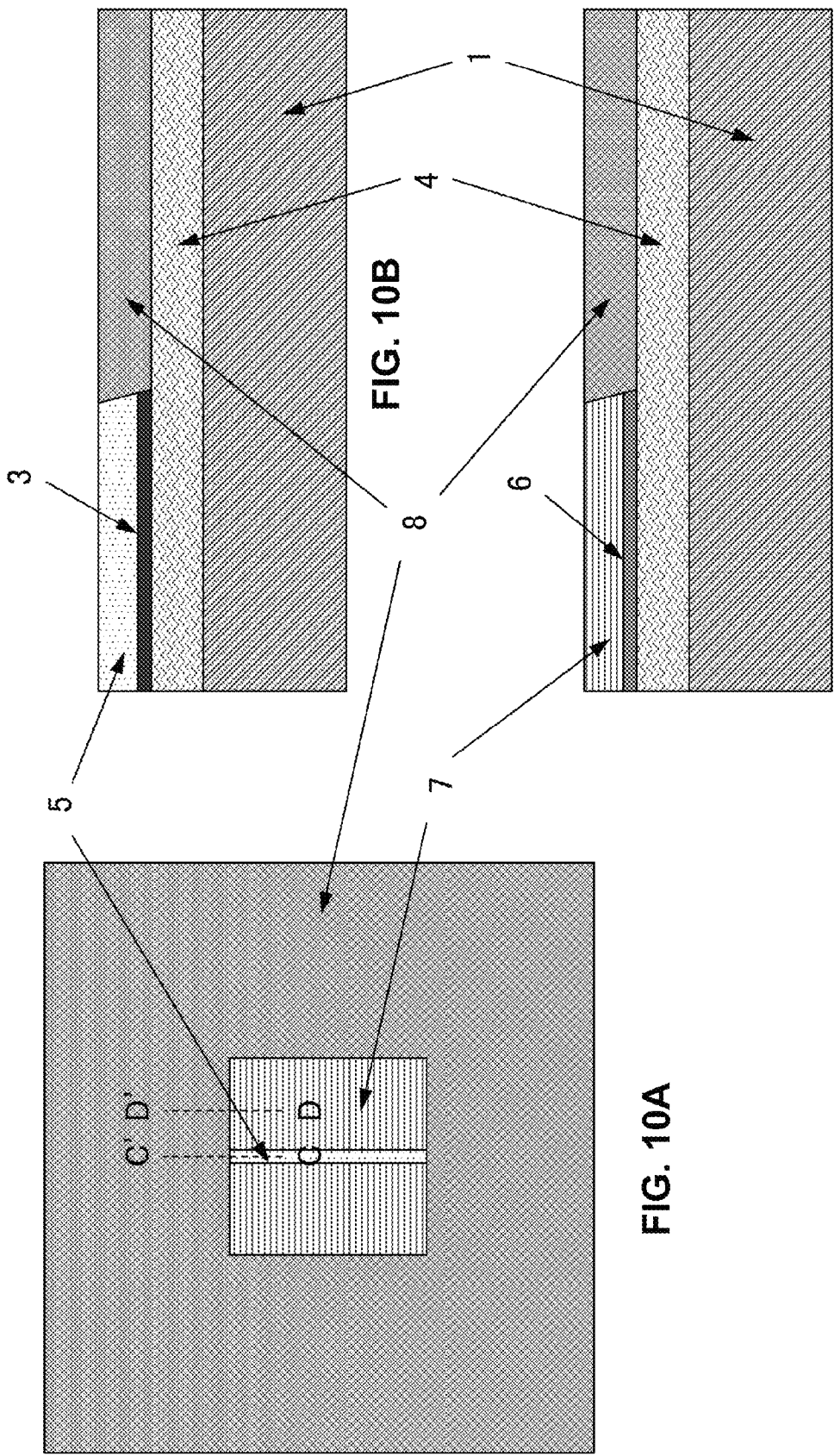

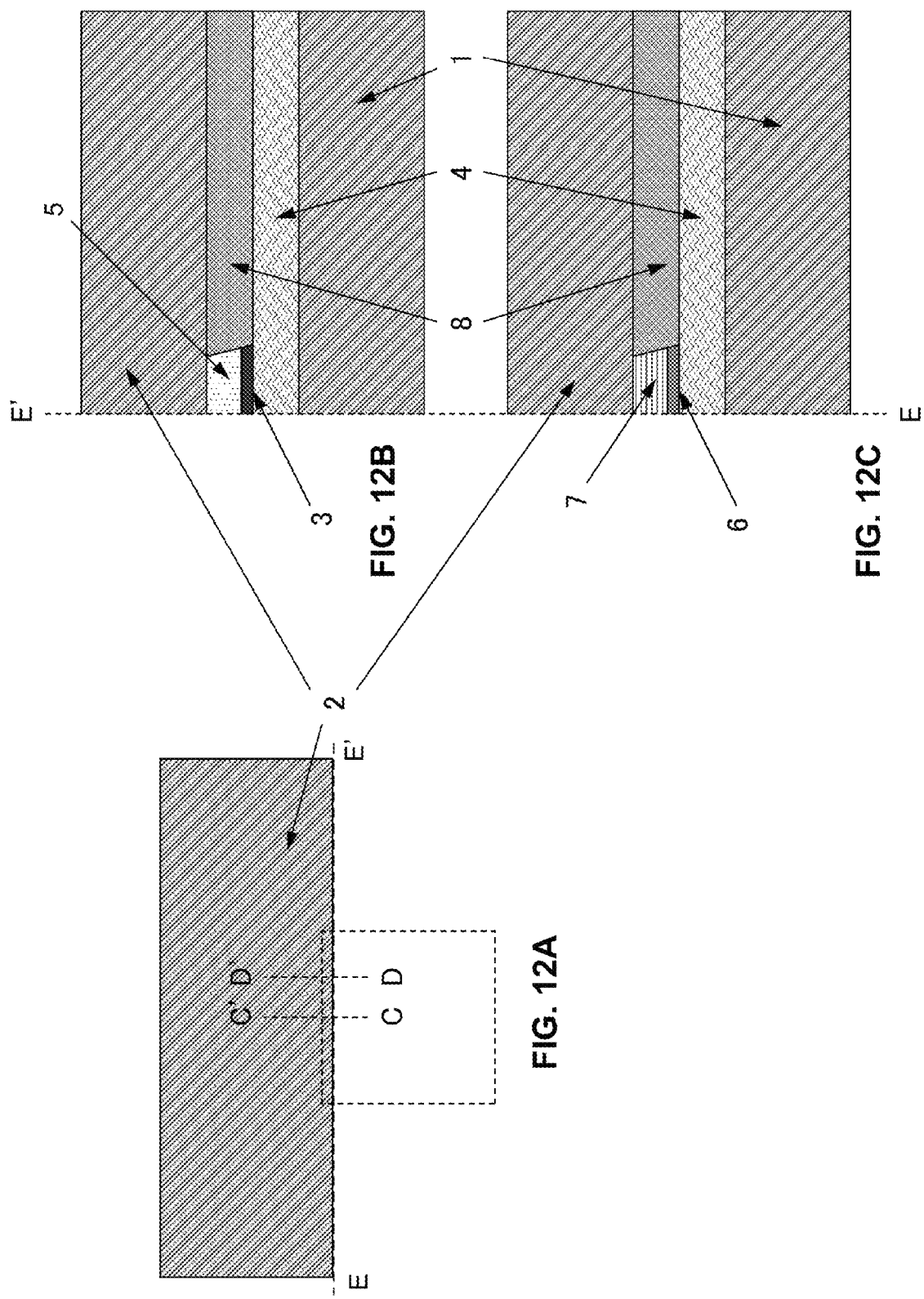

HIGHER STABILITY READ HEAD UTILIZING A PARTIAL MILLING PROCESS

FIELD OF THE INVENTION

The present invention relates to data storage systems, and more particularly, this invention relates to a magnetic read head that offers improved stability due to a partial milling process and systems and operation thereof.

BACKGROUND

The heart of a computer is a magnetic hard disk drive (HDD) which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider into contact with the surface of the disk when the disk is not rotating but, when the disk rotates, air is swirled by the rotating disk adjacent a media-facing surface of the slider causing the slider to ride on an air bearing a slight distance from the surface of the rotating disk. When the slider rides on the air bearing the write and read heads are employed for writing magnetic impressions to and reading magnetic signal fields from the rotating disk. The read and write heads are connected to processing circuitry that operates according to a computer program to implement the writing and reading functions.

The volume of information processing in the information age is increasing rapidly. In particular, it is desired that HDDs be able to store more information in their limited area and volume. A technical approach to this desire is to increase the capacity by increasing the recording density of the HDD. To achieve higher recording density, further miniaturization of recording bits is effective, which in turn typically requires the design of smaller and smaller components.

One attempt at miniaturizing components has led to the use of read heads that employ a magnetoresistance effect film in which a sensing current flows in a direction perpendicular to the plane of the film. These read heads may utilize a tunneling magnetoresistance (TMR) film or a current-perpendicular-to-plane (CPP)-type giant magnetoresistance (GMR) film. Such a film comprises an insulating layer, in the case of a TMR film, or a metallic layer, in the case of a GMR film, that is sandwiched by two ferromagnetic layers. Typically, in the case of the lower ferromagnetic layer, the direction of magnetization is fixed in one direction (e.g., a fixed layer) by a coupling magnetic field having an antiferromagnetic (AFM) layer, while a direction of magnetization of the upper ferromagnetic layer (e.g., a free layer) is rotated by a leakage magnetic field produced from the recording medium. In the case of a TMR film or a GMR film, the magnetoresistance of the film is altered by the relative angle of magnetization of the two ferromagnetic layers. The read output is therefore obtained by sensing a change of the film resistance produced by rotation of the magnetization of the free layer in response to the direction of the leakage magnetic field from each of the recording bits on the recording medium.

The size of the magnetoresistance effect film, e.g., the TMR film or the GMR film, that is exposed at a media-facing surface of the read head must therefore be selected in accordance with a surface recording density of the recording medium. The width of the free layer in the film surface direction that is exposed at the media-facing surface is called the track width and determines read resolution in the track direction.

Also, the magnetoresistance effect film is typically sandwiched, above and below, by soft magnetic shields. A distance (substantially determined by the thickness of the magnetoresistance effect film) between these upper and lower shields is termed the gap length and determines the read resolution in the bit direction. Also, the length of the free layer of the magnetoresistance effect film in the film surface height direction as seen from the media-facing surface is selected to be a suitable length, taking into account the aspect ratio of the track width and the resistance of the magnetoresistance effect film. Basically, these dimensions have to be made progressively smaller as the film recording density of the recording medium is increased.

In addition, magnetic domain control films are typically arranged on the left and right sides, in the track width direction, of the magnetoresistance effect film. A biasing magnetic field, of a suitable magnitude, is applied in the track width direction to the free layer of the magnetoresistance effect film by the magnetic domain control films, in order to ensure linearity of the read output. Previously, a hard magnetic film was employed for the magnetic domain control films, but, in recent years, methods employing a soft magnetic film have been developed. A biasing magnetic field is applied to the free layer by conferring anisotropy on the soft magnetic film using an AFM layer that is arranged on the upper shield layer. When a soft magnetic film is employed, compared with when a hard magnetic film is employed, the biasing magnetic field may be made stronger and the soft magnetic film functions as a shield, so an improvement in read resolution performance in the track direction may be achieved. Consequently, in recent years, there has been a trend towards applying biasing magnetic field using a soft magnetic film.

Recently, with increases in the surface recording density of hard disk drive (HDD) media, the size of the gap length and the track width of the magnetoresistance effect film, as described above, has been reduced to a few tens of nanometers, so the volume of the magnetoresistance effect film has become extremely small. Consequently, the volume of the fixed layer, including the AFM layer of the magnetoresistance effect film, has also become extremely small, leading in recent years to the lowering of the stability of the fixed layer. Consequently, in recent years, read heads which have a fixed layer with as large a volume as possible have been developed in order to ensure stability of the fixed layer.

This structure is formed by using a partial milling process so that a fixed layer remains in the element track direction and height direction. The remaining volume of the fixed layer is greatly increased by using a construction in which the fixed layer is left behind in both the track direction and the height direction, so improved stability can be expected.

However, if such a construction is adopted, in which the fixed layer remains, the space available for providing the magnetic domain control film for applying the biasing magnetic field becomes small. Also, the relative position of the magnetic domain control film with respect to the free layer is elevated. Consequently, when such a construction in which the fixed layer remains behind was adopted a problem arose where the effective biasing magnetic field applied to the free layer becomes insufficient.

This problem is severe when a hard magnetic film of complicated film structure requiring an underlayer film is employed for the magnetic domain control film; however, when a soft magnetic film is employed for the magnetic domain control film, the biasing magnetic field is increased compared with the construction where a hard magnetic film is employed. Unfortunately, there is still the problem the effective biasing magnetic field applied to the free layer being insufficient.

SUMMARY

In one embodiment, a MR read head includes a fixed layer having a first ferromagnetic material that has a direction of magnetization that is fixed, a free layer having a second ferromagnetic material positioned above the fixed layer, the free layer having a direction of magnetization that is not fixed, wherein the fixed layer extends beyond both sides of the free layer in a cross-track direction, and magnetic domain control films positioned on both sides of the free layer at a media-facing surface in the cross-track direction, the magnetic domain control films including a soft magnetic material.

In another embodiment, a method for forming a MR read head includes forming a fixed layer having a first ferromagnetic material that has a direction of magnetization that is fixed above a lower shield layer, forming a free layer having a second ferromagnetic material positioned above the fixed layer, the free layer having a direction of magnetization that is not fixed, forming a first mask above the free layer, the first mask having a predetermined width based on a track width of a magnetic medium, etching the free layer down to the fixed layer using the first mask as a guide, wherein substantially none of the fixed layer is etched, and wherein the fixed layer extends beyond both sides of the free layer in a cross-track direction, and forming magnetic domain control films on both sides of the free layer in the cross-track direction, the magnetic domain control films including a soft magnetic material.

In yet another embodiment, a MR read head includes a fixed layer having a first ferromagnetic material that has a direction of magnetization that is fixed, a free layer having a second ferromagnetic material positioned above the fixed layer, the free layer having a direction of magnetization that is not fixed, wherein the fixed layer extends beyond both sides of the free layer in a cross-track direction, and magnetic domain control films positioned on both sides of the free layer at a media-facing surface in the cross-track direction, the magnetic domain control films including a soft magnetic material, wherein the free layer and the magnetic domain control films have a same height in an element height direction from a media-facing surface.

Any of these embodiments may be implemented in a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 2A is a schematic representation in section of a recording medium utilizing a longitudinal recording format.

FIG. 2B is a schematic representation of a conventional magnetic recording head and recording medium combination for longitudinal recording as in FIG. 2A.

FIG. 2C is a magnetic recording medium utilizing a perpendicular recording format.

FIG. 2D is a schematic representation of a recording head and recording medium combination for perpendicular recording on one side.

FIG. 2E is a schematic representation of a recording apparatus adapted for recording separately on both sides of the medium.

FIG. 3A is a cross-sectional view of one particular embodiment of a perpendicular magnetic head with helical coils.

FIG. 3B is a cross-sectional view of one particular embodiment of a piggyback magnetic head with helical coils.

FIG. 4A is a cross-sectional view of one particular embodiment of a perpendicular magnetic head with looped coils.

FIG. 4B is a cross-sectional view of one particular embodiment of a piggyback magnetic head with looped coils.

FIG. 5A is a cross-sectional view of a magnetoresistance (MR) read head during a manufacturing method from the direction perpendicular to the film surface, according to one embodiment.

FIG. 5B is a cross-sectional view of the MR head during the manufacturing method from the media-facing surface, according to one embodiment.

FIG. 6A is a cross-sectional view of the MR read head during a manufacturing method from the direction perpendicular to the film surface, according to one embodiment.

FIG. 6B is a cross-sectional view of the MR head during the manufacturing method from the media-facing surface, according to one embodiment.

FIG. 8A is a cross-sectional view of the MR read head during a manufacturing method from the direction perpendicular to the film surface, according to one embodiment.

FIG. 8B is a cross-sectional view of the MR head during the manufacturing method from a height direction along the broken line C-C' of FIG. 8A.

FIG. 8C is a cross-sectional view of the MR head during the manufacturing method from a height direction along the broken line D-D' of FIG. 8A.

FIG. 9A is a cross-sectional view of the MR read head during a manufacturing method from the direction perpendicular to the film surface, according to one embodiment.

FIG. 9B is a cross-sectional view of the MR head during the manufacturing method from a height direction along the broken line C-C' of FIG. 9A.

FIG. 9C is a cross-sectional view of the MR head during the manufacturing method from a height direction along the broken line D-D' of FIG. 9A.

FIG. 10A is a cross-sectional view of the MR read head during a manufacturing method from the direction perpendicular to the film surface, according to one embodiment.

FIG. 10B is a cross-sectional view of the MR head during the manufacturing method from a height direction along the broken line C-C' of FIG. 10A.

FIG. 10C is a cross-sectional view of the MR head during the manufacturing method from a height direction along the broken line D-D' of FIG. 10A.

FIG. 12A is a cross-sectional view of the MR read head during a manufacturing method from the direction perpendicular to the film surface, according to one embodiment.

FIG. 12B is a cross-sectional view of the MR head during the manufacturing method from a height direction along the broken line C-C' of FIG. 12A.

FIG. 12C is a cross-sectional view of the MR head during the manufacturing method from a height direction along the broken line D-D' of FIG. 12A.

DETAILED DESCRIPTION

Figure 1:
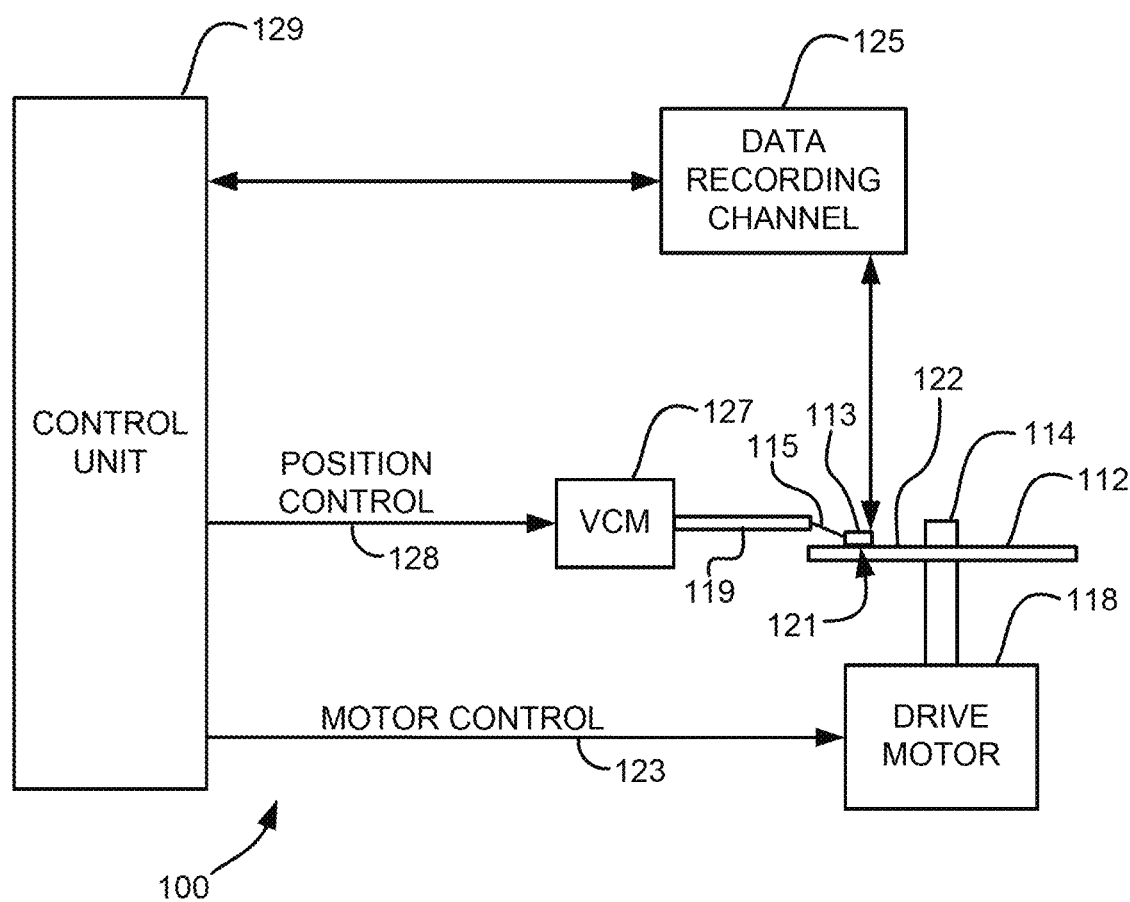
FIG. 1 is a simplified drawing of a magnetic recording disk drive system.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an," and "the" include plural referents unless otherwise specified.

The following description discloses several preferred embodiments of disk-based storage systems and/or related systems and methods, as well as operation and/or component parts thereof.

A magnetoresistance (MR) read head, according to one embodiment, comprises two ferromagnetic layers: a fixed layer comprising a first ferromagnetic material whose direction of magnetization is fixed, and a free layer comprising a second ferromagnetic material whose direction of magnetization is not fixed that is configured for sensing current flows in a direction perpendicular to a film deposition direction, wherein the fixed layer extends beyond sides of the free layer in a cross-track direction, and magnetic domain control films positioned on both sides of the free layer at a media-facing surface in the cross-track direction, the magnetic domain control films comprising a soft magnetic material. The magnetic domain control films are completely cut away in the height direction as seen from the media-facing surface, so as to be cut down to the same position as that of the free layer.

In one general embodiment, a MR read head includes a fixed layer having a first ferromagnetic material that has a direction of magnetization that is fixed, a free layer having a second ferromagnetic material positioned above the fixed layer, the free layer having a direction of magnetization that is not fixed, wherein the fixed layer extends beyond both sides of the free layer in a cross-track direction, and magnetic domain control films positioned on both sides of the free layer at a media-facing surface in the cross-track direction, the magnetic domain control films including a soft magnetic material.

In another general embodiment, a method for forming a MR read head includes forming a fixed layer having a first ferromagnetic material that has a direction of magnetization that is fixed above a lower shield layer, forming a free layer having a second ferromagnetic material positioned above the fixed layer, the free layer having a direction of magnetization that is not fixed, forming a first mask above the free layer, the first mask having a predetermined width based on a track width of a magnetic medium, etching the free layer down to the fixed layer using the first mask as a guide, wherein substantially none of the fixed layer is etched, and wherein the fixed layer extends beyond both sides of the free layer in a cross-track direction, and forming magnetic domain control films on both sides of the free layer in the cross-track direction, the magnetic domain control films including a soft magnetic material.

In yet another general embodiment, a MR read head includes a fixed layer having a first ferromagnetic material that has a direction of magnetization that is fixed, a free layer having a second ferromagnetic material positioned above the fixed layer, the free layer having a direction of magnetization that is not fixed, wherein the fixed layer extends beyond both sides of the free layer in a cross-track direction, and magnetic domain control films positioned on both sides of the free layer at a media-facing surface in the cross-track direction, the magnetic domain control films including a soft magnetic material, wherein the free layer and the magnetic domain control films have a same height in an element height direction from a media-facing surface.

Referring now to FIG. 1, there is shown a disk drive 100 in accordance with one embodiment of the present invention. As shown in FIG. 1, at least one rotatable magnetic medium (e.g., magnetic disk) 112 is supported on a spindle 114 and rotated by a drive mechanism, which may include a disk drive motor 118. The magnetic recording on each disk is typically in the form of an annular pattern of concentric data tracks (not shown) on the disk 112. Thus, the disk drive motor 118 preferably passes the magnetic disk 112 over the magnetic read/write portions 121, described immediately below.

At least one slider 113 is positioned near the disk 112, each slider 113 supporting one or more magnetic read/write portions 121, e.g., of a magnetic head according to any of the approaches described and/or suggested herein. As the disk rotates, slider 113 is moved radially in and out over disk surface 122 so that portions 121 may access different tracks of the disk where desired data are recorded and/or to be written. Each slider 113 is attached to an actuator arm 119 by means of a suspension 115. The suspension 115 provides a slight spring force which biases slider 113 against the disk surface 122. Each actuator arm 119 is attached to an actuator 127. The actuator 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of disk 112 generates an air bearing between slider 113 and disk surface 122 which exerts an upward force or lift on the slider. The air bearing thus counter-balances the slight spring force of suspension 115 and supports slider 113 off and slightly above the disk surface by a small, substantially constant spacing during normal operation. Note that in some embodiments, the slider 113 may slide along the disk surface 122.

The various components of the disk storage system are controlled in operation by control signals generated by controller 129, such as access control signals and internal clock signals. Typically, control unit 129 comprises logic control circuits, storage (e.g., memory), and a microprocessor. In a preferred approach, the control unit 129 is electrically coupled (e.g., via wire, cable, line, etc.) to the one or more magnetic read/write portions 121, for controlling operation thereof. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Read and write signals are communicated to and from read/write portions 121 by way of recording channel 125.

The above description of a typical magnetic disk storage system, and the accompanying illustration of FIG. 1 is for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

In a typical head, an inductive write portion includes a coil layer embedded in one or more insulation layers (insulation stack), the insulation stack being located between first and second pole piece layers. A gap is formed between the first and second pole piece layers by a gap layer at a media-facing surface of the write portion. The pole piece layers may be connected at a back gap. Currents are conducted through the coil layer, which produce magnetic fields in the pole pieces. The magnetic fields fringe across the gap at the media-facing surface for the purpose of writing bits of magnetic field information in tracks on moving media, such as in circular tracks on a rotating magnetic disk.

The second pole piece layer has a pole tip portion which extends from the media-facing surface to a flare point and a yoke portion which extends from the flare point to the back gap. The flare point is where the second pole piece begins to widen (flare) to form the yoke. The placement of the flare point directly affects the magnitude of the magnetic field produced to write information on the recording medium.

The magnetic data storage device of FIG. 1 may include at least one read head as described herein according to any embodiment, a magnetic medium (such as a disk 112), a drive mechanism (such as disk drive motor 118) for passing the magnetic medium over the at least one thermally-assisted magnetic head, and a controller 129 electrically coupled to the at least one thermally-assisted magnetic head for controlling operation of the at least one thermally-assisted magnetic head.

FIG. 2A illustrates, schematically, a conventional recording medium such as used with magnetic disc recording systems, such as that shown in FIG. 1. This medium is utilized for recording magnetic impulses in or parallel to the plane of the medium itself. The recording medium, a recording disc in this instance, comprises basically a supporting substrate 200 of a suitable non-magnetic material such as glass, with an overlying coating 202 of a suitable and conventional magnetic layer.

FIG. 2B shows the operative relationship between a conventional recording/playback head 204, which may preferably be a thin film head, and a conventional recording medium, such as that of FIG. 2A.

FIG. 2C illustrates, schematically, the orientation of magnetic impulses substantially perpendicular to the surface of a recording medium as used with magnetic disc recording systems, such as that shown in FIG. 1. For such perpendicular recording the medium typically includes an under layer 212 of a material having a high magnetic permeability. This under layer 212 is then provided with an overlying coating 214 of magnetic material preferably having a high coercivity relative to the under layer 212.

FIG. 2D illustrates the operative relationship between a perpendicular head 218 and a recording medium. The recording medium illustrated in FIG. 2D includes both the high permeability under layer 212 and the overlying coating 214 of magnetic material described with respect to FIG. 2C above. However, both of these layers 212 and 214 are shown applied to a suitable substrate 216. Typically there is also an additional layer (not shown) called an "exchange-break" layer or "interlayer" between layers 212 and 214.

In this structure, the magnetic lines of flux extending between the poles of the perpendicular head 218 loop into and out of the overlying coating 214 of the recording medium with the high permeability under layer 212 of the recording medium causing the lines of flux to pass through the overlying coating 214 in a direction generally perpendicular to the surface of the medium to record information in the overlying coating 214 of magnetic material preferably having a high coercivity relative to the under layer 212 in the form of magnetic impulses having their axes of magnetization substantially perpendicular to the surface of the medium. The flux is channeled by the soft underlying coating 212 back to the return layer (P1) of the head 218.

FIG. 2E illustrates a similar structure in which the substrate 216 carries the layers 212 and 214 on each of its two opposed sides, with suitable recording heads 218 positioned adjacent the outer surface of the magnetic coating 214 on each side of the medium, allowing for recording on each side of the medium.

FIG. 3A is a cross-sectional view of a perpendicular magnetic head. In FIG. 3A, helical coils 310 and 312 are used to create magnetic flux in the stitch pole 308, which then delivers that flux to the main pole 306. Coils 310 indicate coils extending out from the page, while coils 312 indicate coils extending into the page. Stitch pole 308 may be recessed from the media-facing surface 318. Insulation 316 surrounds the coils and may provide support for some of the elements. The direction of the media travel, as indicated by the arrow to the right of the structure, moves the media past the lower return pole 314 first, then past the stitch pole 308, main pole 306, trailing shield 304 which may be connected to the wrap around shield (not shown), and finally past the upper return pole 302. Each of these components may have a portion in contact with the media-facing surface 318. The media-facing surface 318 is indicated across the right side of the structure.

Perpendicular writing is achieved by forcing flux through the stitch pole 308 into the main pole 306 and then to the surface of the disk positioned towards the media-facing surface 318.

FIG. 3B illustrates a piggyback magnetic head having similar features to the head of FIG. 3A. Two shields 304, 314 flank the stitch pole 308 and main pole 306. Also sensor shields 322, 324 are shown. The sensor 326 is typically positioned between the sensor shields 322, 324.

FIG. 4A is a schematic diagram of one embodiment which uses looped coils 410, sometimes referred to as a pancake configuration, to provide flux to the stitch pole 408. The stitch pole then provides this flux to the main pole 406. In this orientation, the lower return pole is optional. Insulation 416 surrounds the coils 410, and may provide support for the stitch pole 408 and main pole 406. The stitch pole may be recessed from the media-facing surface 418. The direction of the media travel, as indicated by the arrow to the right of the structure, moves the media past the stitch pole 408, main pole 406, trailing shield 404 which may be connected to the wrap around shield (not shown), and finally past the upper return pole 402 (all of which may or may not have a portion in contact with the media-facing surface 418). The media-facing surface 418 is indicated across the right side of the structure. The trailing shield 404 may be in contact with the main pole 406 in some embodiments.

FIG. 4B illustrates another type of piggyback magnetic head having similar features to the head of FIG. 4A including a looped coil 410, which wraps around to form a pancake coil. Also, sensor shields 422, 424 are shown. The sensor 426 is typically positioned between the sensor shields 422, 424.

In FIGS. 3B and 4B, an optional heater is shown near the non-media-facing surface side of the magnetic head. A heater (Heater) may also be included in the magnetic heads shown in FIGS. 3A and 4A. The position of this heater may vary based on design parameters such as where the protrusion is desired, coefficients of thermal expansion of the surrounding layers, etc.

Except as otherwise described herein, the various components of the structures of FIGS. 3A-4B may be of conventional materials and design, as would be understood by one skilled in the art.

A MR read head, according to one embodiment, comprises magnetic domain control films positioned on both sides of the free layer in the cross-track direction which comprise a soft magnetic film. This soft magnetic film is totally removed, leaving behind no residue, in a height direction from the media-facing surface, down to the same position as the free layer. The shape aspect ratio of the soft magnetic film is extremely large, since the length of the free layer in the height direction from the media-facing surface is a few tens of nanometers, as opposed to the width of an ordinary magnetic domain control film in the tracking direction which is a few microns. In one embodiment, the aspect ratio of a width of one magnetic domain control film in the cross-track direction to a thickness of free layer above the fixed layer may be greater than about 25. In other embodiments, the aspect ratio may be greater than 10, 15, 20, 30, or more or less, as suitable for a particular device.

As a result, the shape anisotropy of the soft magnetic film is large, so the biasing magnetic field may have a high intensity in comparison with conventional magnetic read heads. Consequently, a fully sufficient biasing magnetic field may be ensured, while a fixed layer is still retained resulting in a MR read head that may be formed having a fixed layer of high stability.

Also, using a MR read head according to one embodiment, the free layer and the soft magnetic film may be etched in a single process (e.g., at the same time), resulting in the length of the free layer and the length of the soft magnetic film in the height direction from the media-facing surface being aligned. If the length of the free layer in the height direction from the media-facing surface is longer in comparison with that of the soft magnetic film, the biasing magnetic field becomes weak because the charge appearing at the junction of the free layer and the soft magnetic film becomes small; conversely, if the length of the soft magnetic film is greater, magnetic domain structures tend to be generated in the area of the soft magnetic film, so there is a risk that instability may be increased. However, by performing etching simultaneously, the risk described above is eliminated; furthermore, compared with the case where forming is performed in separate processes, variability of the length of the soft magnetic film in the height direction from the media-facing surface may be greatly reduced.

With reference to FIGS. 5A-12C, a method of manufacturing a MR read head is described according to one embodiment. FIGS. 5A, 5B, 6A, 6B, 7A, and 7B are diagrams of a process for forming a track pattern and respectively show in FIGS. 5A, 6A, and 7A, a top face view in which the film surface is parallel with the plane of the Figure, and in FIGS. 5B, 6B, and 7B, cross-sectional views from the media-facing surface direction along the broken line B-B' of the upper face view. FIGS. 8A, 8B, 8C, 9A, 9B, 9C, 10A, 10B, 10C, 11A, 11B, 11C, 12A, 12B, and 12C are views showing a process of forming a height pattern, with FIGS. 8A, 9A, 10A, 11A, and 12A showing upper face views in which the film surface is parallel with the plane of the Figure, FIGS. 8B, 9B, 10B, 11B, and 12B showing cross-sectional views in the height direction of the upper face view along the broken line C-C', and FIGS. 8C, 9C, 10C, 11C, and 12C being cross-sectional views in the height direction along the broken line D-D'. A MR read head according to one embodiment may be formed by a process in which the track pattern is formed first and the height pattern is formed afterward.

In order to form the track pattern, onto a MR film there may be applied or deposited a photoresist and, apart from this photoresist, a mask 9, comprising a soft magnetic shielding film 1 and an insulating layer 3 (or metallic layer in some approaches), fixed layer 4, and free layer 5, may be deposited by a sputtering or plating method onto a substrate as shown in FIGS. 5A-5C. Then, patterning of the mask 9 is performed by photolithography and etching, such as RIE, is performed. For the soft magnetic shielding film 1, a soft magnetic film comprising NiFe or an alloy of NiFe may be used in some approaches, such as NiFeMo or some other suitable alloy known in the art.

For the MR film, a tunneling magnetoresistive (TMR) film may be used in some approaches. Consequently, for the fixed layer 4 and free layer 5, various types of soft magnetic alloy films may be employed, such as NiFe, CoFe, CoFeB, and alloys of NiFe, CoFe, etc., as would be known to one of skill in the art. Between the fixed layer 4 and the free layer 5, an insulating layer 3 comprising MgO, $Al_2O_3$, or the like, may be employed.

When a CPP-GMR film is used as the MR film, a metallic material such as Cu, Au, and/or Ag or some other material known in the art may be used between the fixed layer 4 and the free layer 5. For the fixed layer 4, an antiferromagnetic (AFM) layer, such as MnIr or the like, may be used. The direction of magnetization for this layer is fixed in a single direction by a suitable heat treatment, such as annealing. The width of the mask 9 in the cross-track direction 11 is a few tens of nanometers, with a suitable thickness thereof being set, which takes into account the selection ratio of the materials, pattern collapse, liftoff characteristics, etc.

Next, as shown in FIGS. 6A-6C, etching of the free layer 5 is performed using Ar ion milling, reactive ion etching (RIE), or the like, so as to leave a fixed layer 4 of the MR film. It should be noted that, while no problems are encountered when some of the insulating layer 3 remains behind, no free layer 5 must be left and preferably the fixed layer 4 is, as far as possible, not exposed to etching. Consequently, the etching may be performed with high precision, using endpoint detection by elementary analysis of the MR film which is the material that is being etched.

Figures 7A, 7B:
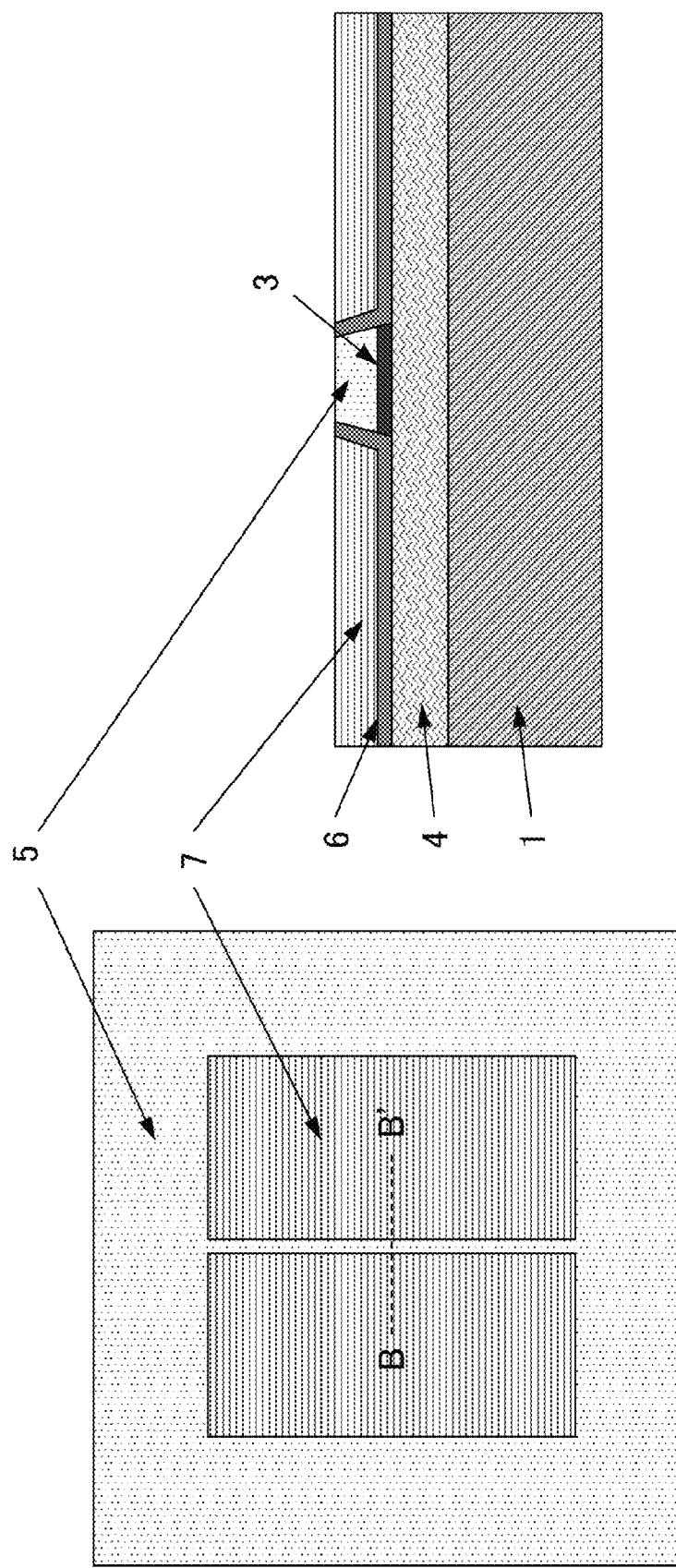
FIG. 7A is a cross-sectional view of the MR read head during a manufacturing method from the direction perpendicular to the film surface, according to one embodiment.
FIG. 7B is a cross-sectional view of the MR head during the manufacturing method from the media-facing surface, according to one embodiment.

Next, as shown in FIGS. 7A-7C, an insulating film 6 and magnetic domain control film 7 are deposited, such as via sputtering, atomic layer deposition (ALD), and the like, and the mask 9 is removed by liftoff or some other suitable removal process known in the art. A planarization process, such as via chemical mechanical polishing (CMP), may be combined therewith after liftoff, but, in this case, use of a stop film becomes useful. As the insulating film 6, $Al_2O_3$, $S_3N_4$, $Ta_2O_5$ or the like may be employed, in some approaches. For the magnetic domain control films 7, a soft magnetic film comprising NiFe, NiFeMo, some alloy of NiFe, or the like may be used.

It should be noted that, since the magnetic domain control film 7 is totally removed in the height direction when forming the height pattern, as will be described later, this magnetic domain control film 7 may be set to have no more than a predetermined film thickness. However, if the film thickness of the magnetic domain control film 7 is not thick enough (e.g., too thin), the biasing magnetic field becomes weak, so an appropriate film thickness is desired for proper operation.

Next, in order to form the height pattern, as shown in FIGS. 8A-8C, the photoresist and a mask 10 are applied and/or deposited, and patterning of the mask 10 is performed by etching, such as via photolithography, RIE, or the like. The width of the pattern is usually a few microns and is set to a suitable thickness by taking into account the selection ratio of the materials, liftoff characteristics, etc., using a determination process known in the art.

Next, as shown in FIGS. 9A-9C, etching of the free layer 5 is performed in the element height direction 16 using, for example Ar milling, RIE, or the like, so as to leave a fixed layer 4 of the MR film. In the same way as in the case of formation of the track pattern, there are no problems encountered when some of the insulating layer 3 is left behind, but etching must be performed so that none of the free layer 5 remains. Also, the etching is performed with high precision, using endpoint detection employing elementary analysis. In the MR read head according to this embodiment, the magnetic domain control film 7 is also simultaneously etched so as to be completely removed in the element height direction 16 where etching is performed thereon.

Since etching is performed using endpoint detection by elementary analysis of the MR film, the etching amount changes depending on the film thickness of the upper insulating layer 3 and free layer 5 (or cap layer when present), from the fixed layer 4 of the MR film. Consequently, the magnetic domain control film 7 may be completely removed where etched by specifying a suitable film thickness of the magnetic domain control film 7 and making the cap layer or any other layers present thereon thick and increasing the etching amount of the magnetic domain control film 7. In this way, the magnetic domain control film 7 is substantially or completely removed in the element height direction 16 and the free layer 5 and magnetic domain control film 7 are completely cut back to the same position, so variability of the difference in lengths in the element height direction 16 towards the media-facing surface is eliminated.

Then, as shown in FIGS. 10A-10C, the insulating film 8 is deposited by sputtering, ALD, or the like, and the mask 10 is removed by liftoff or some other suitable process known in the art. For the insulating film 8, $Al_2O_3$, $Si_3N_4$, $Ta_2O_5$, or the like, may be used. Just as in the case of the track side, a planarization process, using CMP or the like, after liftoff may be combined therewith, but, in this case, a stop film may be employed.

Figures 11A, 11B, 11C:
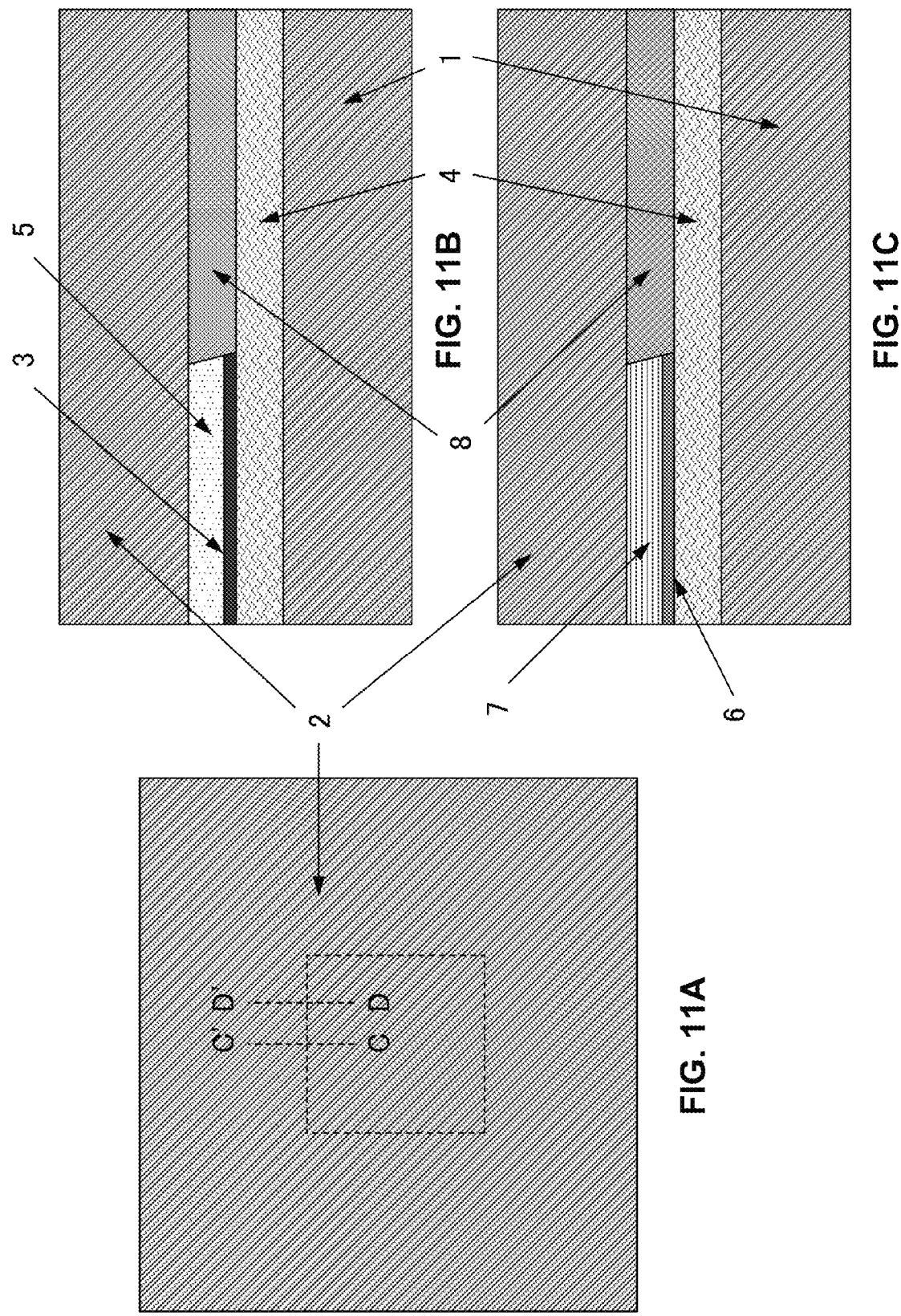
FIG. 11A is a cross-sectional view of the MR read head during a manufacturing method from the direction perpendicular to the film surface, according to one embodiment.
FIG. 11B is a cross-sectional view of the MR head during the manufacturing method from a height direction along the broken line C-C' of FIG. 11A.
FIG. 11C is a cross-sectional view of the MR head during the manufacturing method from a height direction along the broken line D-D' of FIG. 11A.

Next, as shown in FIGS. 11A-11C, a soft magnetic shielding film 2 is deposited as an upper shield layer (USL), for example by sputtering or some other suitable method known in the art. As the soft magnetic shielding film 2, a soft magnetic film comprising NiFe or the like may be employed. In order to confirm anisotropy on the magnetic domain control film 7, the magnetization is fixed in the track direction by using an AFM layer deposited above the soft magnetic shielding film 2, such as MnIr or the like. For the soft magnetic shielding film 2 contacting the AFM layer, a single-layer structure or a synthetic ferrimagnetic structure in which AFM coupling is achieved by insertion of a layer of Ru or the like between the layers may be employed. The thickness of the layers and their construction are determined so as to produce a suitable anisotropic magnetic field.

Then, as shown in FIGS. 12A-12C, a lapping process is performed after completion of the wafer processing. The broken line E-E' in FIG. 12A is the final media-facing surface. The length of the free layer and the magnetic domain control film 7 in the height direction from the media-facing surface is determined from this line. The length is a few tens of nanometers, according to some approaches. Consequently, the shape aspect ratio of the magnetic domain control film 7 may be made extremely large, making it possible to make the magnetic field that is applied to the free layer 5 of a higher intensity in comparison with conventional structures.

As shown in FIGS. 12A-12C, the MR read head comprises a fixed layer 4 comprising a first ferromagnetic material that has a direction of magnetization that is fixed, a free layer 5 comprising a second ferromagnetic material positioned above the fixed layer 4, the free layer 5 having a direction of magnetization that is not fixed, and magnetic domain control films 7 positioned on both sides of the free layer 5 at a media-facing surface in the cross-track direction, the magnetic domain control films 7 comprising a soft magnetic material. The fixed layer 4 extends beyond both sides of the free layer 5 in the cross-track direction.

In one embodiment, a height of the magnetic domain control films 7 in the element height direction coincides with a height of the free layer 5 in the element height direction. Moreover, an aspect ratio of a width of one magnetic domain control film 7 in the cross-track direction to the height of the magnetic domain control films 7 may be greater than about 25. In this way, the magnetic domain control films 7 are greater in width than in height. Also, the first and second ferromagnetic materials may comprise at least one of: NiFe, CoFe, and CoFeB, or some other suitable material known in the art.

Figure 13A:
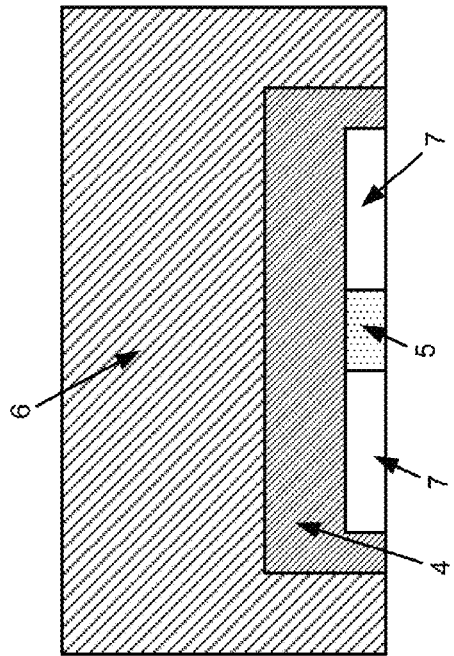
FIG. 13A is a cross-sectional view of the MR read head from a media-facing surface, according to one embodiment.
Figure 13B:
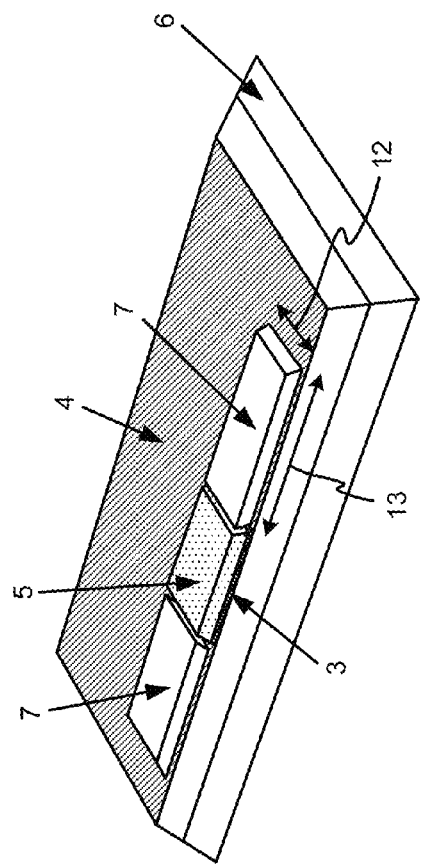
FIG. 13B is a cross-sectional view of the MR head from a top down direction.
Figure 13C:
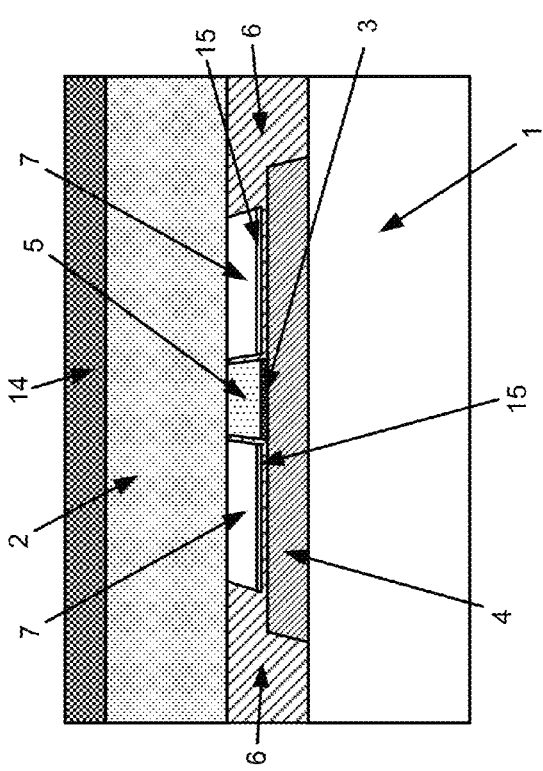
FIG. 13C is a perspective view of a portion of the MR head.

FIGS. 13A-13C depict a structure for magnetic reading of data from a magnetic medium, in accordance with one embodiment. FIG. 13A is a cross-sectional view from a media-facing surface of the MR head, FIG. 13B shows a top down view with the soft magnetic shielding film 2 removed for clarity, and FIG. 13C shows a perspective view of the MR head. As an option, the present structure may be implemented in conjunction with features from any other embodiment listed herein, such as those described with reference to the other Figures. Of course, however, such a structure and others presented herein may be used in various applications and/or in permutations which may or may not be specifically described in the illustrative embodiments listed herein. Further, the structure presented herein may be used in any desired environment.

As shown in FIGS. 13A-13C, a height 12 of the magnetic domain control films 7 in the element height direction coincides with a height of the free layer 5 in the element height direction. Moreover, an aspect ratio of a width 13 of one magnetic domain control film 7 in the cross-track direction to the height 12 of the magnetic domain control films 7 may be greater than about 25.

In another approach, the soft magnetic shielding film 2 may form a USL. As the soft magnetic shielding film 2, a soft magnetic film comprising NiFe or the like may be employed. In order to confirm anisotropy on the magnetic domain control film 7, the magnetization is fixed in the track direction by using an AFM layer 14 deposited above the soft magnetic shielding film 2, such as MnIr or the like. For the soft magnetic shielding film 2 contacting the AFM layer 14, a single-layer structure or a synthetic ferrimagnetic structure in which AFM coupling is achieved by insertion of a layer of Ru or the like between the layers may be employed (not shown, but may be one or more layers interspersed throughout the soft magnetic shielding film 2 along a direction perpendicular to a plane of formation thereof). The thickness of the layers and their construction are determined so as to produce a suitable anisotropic magnetic field.

In another embodiment, an underlayer 15 may be positioned below each magnetic domain control film 7 on both sides of the free layer 5 in the cross-track direction. The underlayers 15 each may comprise a material selected from a group consisting of Ta, Ru, NiTa, and Cr, or the like. In one approach, the insulating film 6 may be provided below the underlayers 15, but is not required to be so positioned.

Figure 14:
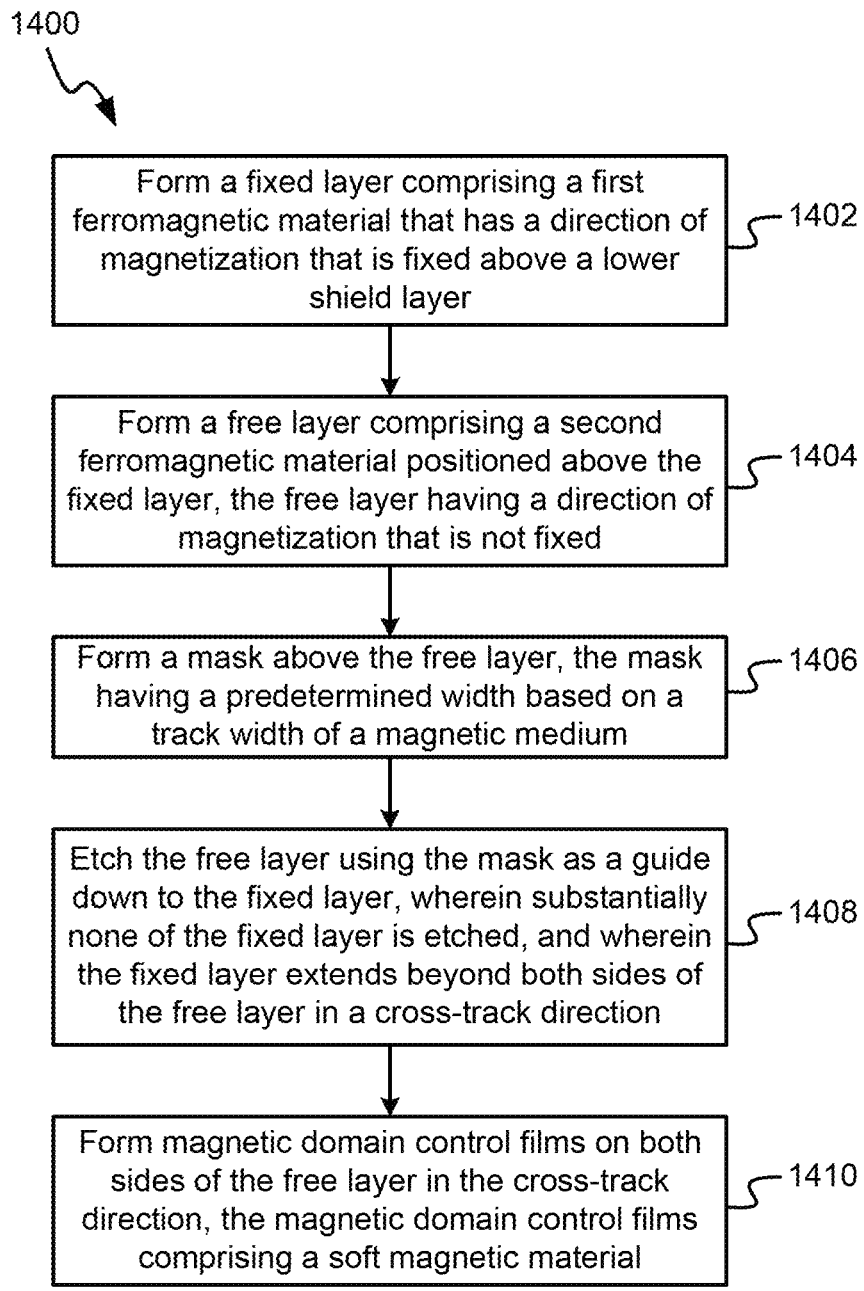
FIG. 14 shows a flowchart of a method according to one embodiment.

Now referring to FIG. 14, a method 1400 for manufacturing a MR read head is described, according to one embodiment. In addition, method 1400 may be performed in accordance with the present invention in any of the environments depicted in FIGS. 1-13C, among others, in various embodiments. Of course, however, this method 1400 and others presented herein may be used to form magnetic structures for a wide variety of devices and/or purposes which may or may not be related to magnetic recording. Further, the methods presented herein may be carried out in any desired environment. It should also be noted that any aforementioned features may be used in any of the embodiments described in accordance with the various methods. Moreover, more or less operations than those specifically described in FIG. 14 may be included in method 1400, as would be understood by one of skill in the art upon reading the present descriptions.

As shown in FIG. 14, method 1400 may initiate with operation 1402, a fixed layer is formed above a lower shield layer, the fixed layer comprises a first ferromagnetic material that has a direction of magnetization that is fixed. The first ferromagnetic material may comprise NiFe, CoFe, and CoFeB, or some other suitable material known in the art.

In operation 1404, a free layer is formed above the fixed layer, the free layer having a direction of magnetization that is not fixed. The free layer may comprise a second ferromagnetic material, such as NiFe, CoFe, and CoFeB, or some other suitable material known in the art.

In operation 1406, a first mask is formed above the free layer, the first mask having a predetermined width based on a track width of a magnetic medium. In this way, the free layer may be etched away at positions that are not protected by the first mask.

In operation 1408, the free layer is etched using the first mask as a guide down to the fixed layer. Substantially none of the fixed layer is etched during this process (e.g., no material is etched from the fixed layer or a very minimal amount of material is etched, e.g., less than about 0.1%45% of the overall material may be etched from the fixed layer). Due to this etching process, the fixed layer now extends beyond both sides of the free layer in a cross-track direction.

In one embodiment, the etching may be performed using endpoint detection employing elementary analysis to stop etching before substantially any of the fixed layer is removed.

In operation 1410, magnetic domain control films are formed on both sides of the free layer in the cross-track direction, the magnetic domain control films comprising a soft magnetic material of a type known in the art, such as NiFe, NiFeMo, and/or an alloy of NiFe, or the like.

Method 1400 may further comprise planarizing to remove the first mask and to cause an upper surface of the magnetic domain control films to coincide with an upper surface of the free layer at the media-facing surface.

In a further embodiment, a second mask may be formed above the free layer and the magnetic domain control films, the second mask having a predetermined height in an element height direction. Also, the free layer and the magnetic domain control films may be etched using the second mask as a guide in order to cause the free layer and the magnetic domain control films to have a same height in the element height direction.

In one embodiment, the etching may be performed using endpoint detection employing elementary analysis to stop etching before substantially any of the fixed layer is removed.

Also, in on embodiment, an insulating layer may be formed between the free layer and the fixed layer, the insulating layer comprising $MgO$, $Si_3N_4$, $Ta_2O_5$, and/or $Al_2O_3$. In an alternate embodiment, a conductive metallic layer may be formed between the free layer and the fixed layer, the conductive metallic layer comprising Cu, Au, and/or Ag, with the fixed layer comprising an AFM layer of a material known in the art.

According to another embodiment, underlayers may be formed below each of the magnetic domain control films, the underlayers each comprising a material selected from a group consisting of Ta, Ru, NiTa, and Cr, wherein the soft magnetic material of the magnetic domain control films comprises at least one of NiFe and NiFeMo, or the like.

Method 1400 may also include forming an upper shield layer above the free layer and the lower shield layer below the fixed layer, the upper and lower shields comprising a material of a type known in the art, such as NiFe, NiFeMo, or the like. Furthermore, the upper shield layer may be a soft magnetic control film and may have a single-layer structure or a synthetic ferrimagnetic structure coupled with a layer of Ru, in various embodiments. Moreover, an AFM layer comprising any suitable material, such as MnIr and the like, may be formed above the upper shield layer in some approaches.

In one embodiment, an aspect ratio of a width of one magnetic domain control film in the cross-track direction to a height of one magnetic domain control film in an element height direction may be about 25 or greater, such as about 30, 35, 50, etc.

It should be noted that methodology presented herein for at least some of the various embodiments may be implemented, in whole or in part, in computer hardware, software, by hand, using specialty equipment, etc. and combinations thereof.

Moreover, any of the structures and/or steps may be implemented using known materials and/or techniques, as would become apparent to one skilled in the art upon reading the present specification.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A magnetoresistive (MR) read head, comprising:
   a fixed layer comprising a first ferromagnetic material that has a direction of magnetization that is fixed;

a free layer comprising a second ferromagnetic material positioned above the fixed layer, the free layer having a direction of magnetization that is not fixed, wherein the fixed layer extends beyond both sides of the free layer in a cross-track direction, and wherein the fixed layer extends beyond a back side of the free layer in an element height direction perpendicular to the cross-track direction; and magnetic domain control films positioned on both sides of the free layer at a media-facing surface in the cross-track direction, the magnetic domain control films comprising a soft magnetic material, wherein the fixed layer extends beyond both sides of the magnetic domain control films in the cross-track direction.

2. The MR read head as recited in claim 1, wherein the soft magnetic material of the magnetic domain control films comprises at least one of NiFe and NiFeMo.

3. The MR read head as recited in claim 1, further comprising:
an insulating layer positioned between the free layer and the fixed layer; or
a conductive metallic layer positioned between the free layer and the fixed layer.

4. The MR read head as recited in claim 1, wherein an aspect ratio of a width of one magnetic domain control film in the cross-track direction to a height of one magnetic domain control film in the element height direction is about 25 or greater.

5. The MR read head as recited in claim 1, further comprising an upper shield layer positioned above the free layer and a lower shield layer positioned below the fixed layer, wherein the upper shield layer comprises a single-layer structure or a synthetic ferrimagnetic structure coupled with a layer of Ru.

6. The MR read head as recited in claim 5, further comprising an antiferromagnetic (AFM) layer positioned above the upper shield layer.

7. The MR read head as recited in claim 5, wherein the free layer and the magnetic domain control films have a same height in the element height direction from a media-facing surface.

8. The MR read head as recited in claim 1, further comprising underlayers positioned below each of the magnetic domain control films, the underlayers each comprising a material selected from a group consisting of Ta, Ru, NiTa, and Cr.

9. A magnetic data storage system, comprising:
at least one MR read head as recited in claim 1;
a magnetic medium;
a drive mechanism for passing the magnetic medium over the at least one MR read head; and
a controller electrically coupled to the at least one MR read head for controlling operation of the at least one MR read head.

10. A method for forming a magnetoresistive (MR) read head, the method comprising:
forming a fixed layer comprising a first ferromagnetic material that has a direction of magnetization that is fixed above a lower shield layer;
forming a free layer comprising a second ferromagnetic material positioned above the fixed layer, the free layer having a direction of magnetization that is not fixed;
forming a first mask above the free layer, the first mask having a predetermined width based on a track width of a magnetic medium;

etching the free layer down to the fixed layer using the first mask as a guide, wherein substantially none of the fixed layer is etched, wherein the fixed layer extends beyond both sides of the free layer in a cross-track direction, and wherein the fixed layer extends beyond a back side of the free layer in an element height direction perpendicular to the cross-track direction; and forming magnetic domain control films on both sides of the free layer in the cross-track direction, the magnetic domain control films comprising a soft magnetic material, wherein the fixed layer extends beyond both sides of the magnetic domain control films in the cross-track direction.

11. The method as recited in claim 10, further comprising planarizing to remove the first mask and to cause an upper surface of the magnetic domain control films to coincide with an upper surface of the free layer at a media-facing surface.

12. The method as recited in claim 10, further comprising:
forming a second mask above the free layer and the magnetic domain control films, the second mask having a predetermined height in an element height direction; and
etching the free layer and the magnetic domain control films using the second mask as a guide in order to cause the free layer and the magnetic domain control films to have a same height in an element height direction.

13. The method as recited in claim 10, further comprising forming underlayers below each of the magnetic domain control films, the underlayers each comprising a material selected from a group consisting of Ta, Ru, NiTa, and Cr, wherein the soft magnetic material of the magnetic domain control films comprises NiFeMo.

14. The method as recited in claim 10, further comprising:
forming an insulating layer between the free layer and the fixed layer; or
forming a conductive metallic layer between the free layer and the fixed layer.

15. The method as recited in claim 10, wherein an aspect ratio of a width of one magnetic domain control film in the cross-track direction to a height of one magnetic domain control film in an element height direction is about 25 or greater.

16. The method as recited in claim 10, further comprising forming an upper shield layer above the free layer and the lower shield layer below the fixed layer, wherein the upper shield layer comprises a single-layer structure or a synthetic ferrimagnetic structure coupled with a layer of Ru.

17. The method as recited in claim 16, further comprising forming an antiferromagnetic (AFM) layer above the upper shield layer.

18. The method as recited in claim 10, wherein the etching is performed using endpoint detection employing elementary analysis to stop etching before substantially any of the fixed layer is removed.

19. A magnetoresistive (MR) read head, comprising:
a fixed layer comprising a first ferromagnetic material that has a direction of magnetization that is fixed;
a free layer comprising a second ferromagnetic material positioned above the fixed layer, the free layer having a direction of magnetization that is not fixed, wherein the fixed layer extends beyond both sides of the free layer in a cross-track direction, and wherein the fixed layer extends beyond a back side of the free layer in an element height direction perpendicular to the cross-track direction; and magnetic domain control films positioned on both sides of the free layer at a media-facing surface in the cross-track direction, the magnetic domain control films comprising a soft magnetic material, wherein the free layer and the magnetic domain control films have a same height in the element height direction from a media-facing surface, and wherein the fixed layer extends beyond both sides of the magnetic domain control films in the cross-track direction.

20. The MR read head as recited in claim 19, further comprising:

an insulating layer or a conductive metallic layer positioned between the free layer and the fixed layer;

an upper shield layer positioned above the free layer and a lower shield layer positioned below the fixed layer, wherein the upper shield layer comprises a single-layer structure or a synthetic ferrimagnetic structure coupled with a layer of Ru; and an antiferromagnetic (AFM) layer positioned above the upper shield layer.

\* \* \* \* \*